(12) United States Patent
Tsai et al.

(10) Patent No.: US 11,486,899 B2
(45) Date of Patent: Nov. 1, 2022

(54) WAFER TEST SYSTEM AND METHODS THEREOF

(71) Applicant: NANYA TECHNOLOGY CORPORATION, New Taipei (TW)

(72) Inventors: Chia-Lin Tsai, Taoyuan (TW); Wun-Ye Ku, Taoyuan (TW); Tien-Yu Chen, New Taipei (TW); Chia-Yi Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 182 days.

(21) Appl. No.: 16/778,746

(22) Filed: Jan. 31, 2020

(65) Prior Publication Data

US 2021/0239736 A1 Aug. 5, 2021

(51) Int. Cl.
*G01R 1/073* (2006.01)
*G01R 31/3193* (2006.01)
*G01R 31/319* (2006.01)
*G01R 1/067* (2006.01)

(52) U.S. Cl.
CPC ...... *G01R 1/07342* (2013.01); *G01R 1/06711* (2013.01); *G01R 31/31905* (2013.01); *G01R 31/31935* (2013.01)

(58) Field of Classification Search
None
See application file for complete search history.

(56) References Cited

U.S. PATENT DOCUMENTS

| | | | | |
|---|---|---|---|---|
| 5,644,245 A | * | 7/1997 | Saitoh | G01R 31/2891 324/750.18 |
| 2004/0081349 A1 | * | 4/2004 | Chaya | G06T 7/0004 382/145 |
| 2011/0254574 A1 | * | 10/2011 | Tashiro | G01R 31/2887 324/762.01 |
| 2014/0021970 A1 | | 1/2014 | Endres et al. | |

FOREIGN PATENT DOCUMENTS

| | | |
|---|---|---|
| CN | 101431039 A | 5/2009 |
| CN | 106558513 A | 4/2017 |
| CN | 108344887 A | 7/2018 |
| TW | 200941609 A | 10/2009 |

* cited by examiner

*Primary Examiner* — Nasima Monsur
(74) *Attorney, Agent, or Firm* — Xuan Zhang (57) ABSTRACT

A wafer test system includes a probe apparatus, a data server, an automation subsystem, and a probe mark assessment subsystem. The probe apparatus includes a probe card, a tester, and a camera. The probe card includes probe pins for contacting test pads in the wafer, and the camera captures an image of the test pads. The automation subsystem obtains an image specification from the probe apparatus and triggers an automated assessment of a probe mark in the image of the test pads. The probe mark assessment subsystem performs the automated assessment of the probe mark in the image of the test pads. The probe mark assessment subsystem performs an image-processing operation to obtain a probe mark assessment result, and the automation subsystem stops the probe apparatus if the probe mark assessment result indicates a probe test failure.

12 Claims, 6 Drawing Sheets

WAFER TEST SYSTEM AND METHODS THEREOF

TECHNICAL FIELD

The present disclosure relates to a test system, and more particularly, to a wafer test system and methods thereof.

DISCUSSION OF THE BACKGROUND

The semiconductor industry has experienced continued rapid growth due in part to improvements in integration density. Generally, it is necessary to test the electrical characteristics of integrated circuit devices at the wafer level to check whether the integrated circuit device satisfies the product specification. Integrated circuit devices with electrical characteristics satisfying the specification are selected for the subsequent packaging process, while other devices are discarded to avoid additional packaging cost. Often, another electrical property test is performed on the integrated circuit device after the packaging process is completed to screen out the substandard devices to increase the product yield. Human inspection is often required to inspect the probe marks of the prober tools performing these tests, which leads to error and capacity loss. Therefore, it is crucial that quality inspection of the probe pins in the prober tools become automated and immediate.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a test system of a wafer including a probe apparatus, a data server, an automation subsystem, and a probe mark assessment subsystem. The probe apparatus includes a probe card, a tester, and a camera, wherein the probe card includes one or more probe pins for contacting one or more test pads on a device under test (DUT) in the wafer, the tester provides an electrical signal to test the DUT, and the camera captures an image of the test pads after the test pads have been contacted by the probe pins. The probe apparatus uploads the image of the test pads to the data server. The automation subsystem obtains an image specification from the probe apparatus and triggers an automated assessment of a probe mark in the image of the test pads. The probe mark assessment subsystem performs the automated assessment of the probe mark in the image of the test pads, wherein the probe mark assessment subsystem downloads the image of the test pads from the data server and performs an image-processing operation to obtain a probe mark assessment result, and the automation subsystem stops the probe apparatus if the probe mark assessment result indicates a probe test failure.

In some embodiments, the automated assessment performed by the probe mark assessment subsystem determines whether a distance from the probe mark to a border of the test pads is within a first threshold value, and the probe test failure is indicated in the probe mark assessment result when the distance from the probe mark to the border of the test pads is within the first threshold value.

In some embodiments, the automated assessment performed by the probe mark assessment subsystem determines whether the distance from the probe mark to a border of the test pads is within a second threshold value, and the probe test failure is indicated in the probe mark assessment result when the distance from the probe mark to the border of the test pads is within the second threshold value.

In some embodiments, the automated assessment performed by the probe mark assessment subsystem determines whether an area of the probe mark is greater than a third threshold value, and the probe test failure is indicated in the probe mark assessment result when the area of the probe mark is greater than the third threshold value.

In some embodiments, the automated assessment performed by the probe mark assessment subsystem determines whether a quantity of the probe mark is less than a fourth threshold value, and the probe test failure is indicated in the probe mark assessment result when the quantity of the probe mark is less than the fourth threshold value.

In some embodiments, the automation subsystem stops the probe apparatus if the probe mark failure is indicated by the probe mark assessment result within a predetermined time limit.

In some embodiments, the probe mark assessment subsystem uploads an analyzed image of the test pads to the data server.

In some embodiments, the test system further includes a test result distribution subsystem for delivering a report of the probe mark assessment result.

In some embodiments, the test result distribution subsystem delivers the report of the probe mark assessment result by electronic mail.

In some embodiments, the test system further includes an error-monitoring subsystem receiving an error code information and a lot control information from the automation subsystem, wherein the automation subsystem determines the error code information and the lot control information from the probe mark assessment result received from the probe mark assessment subsystem.

Another aspect of the present disclosure provides a method for testing a wafer, including capturing, by a camera in a probe apparatus, an image of one or more test pads on a device under test (DUT) in the wafer after the test pads have been contacted by one or more probe pins of the probe apparatus; uploading the image of the test pads to a data server; obtaining, by an automation subsystem, an image specification from the probe apparatus and triggering an automated assessment of a probe mark in the image of the test pads; performing, by a probe mark assessment subsystem, the automated assessment of the probe mark in the image of the test pads, wherein the probe mark assessment subsystem downloads the image of the test pads from the data server and performs an image-processing operation to obtain a probe mark assessment result; and stopping, by the automation subsystem, the probe apparatus if the probe mark assessment result indicates a probe test failure.

In some embodiments, the automated assessment performed by the probe mark assessment subsystem determines whether a distance from the probe mark to a border of the test pads is within a first threshold value, and the probe test failure is indicated in the probe mark assessment result when the distance from the probe mark to the border of the test pads is within a first threshold value.

In some embodiments, the automated assessment performed by the probe mark assessment subsystem determines whether the distance from the probe mark to the border of the test pads is within a second threshold value, and the probe test failure is indicated in the probe mark assessment result when the distance from the probe mark to the border of the test pads is within the second threshold value.

In some embodiments, the automated assessment performed by the probe mark assessment subsystem determines whether an area of the probe mark is greater than a third threshold value, and the probe test failure is indicated in the probe mark assessment result when the area of the probe mark is greater than the third threshold value.

In some embodiments, the automated assessment performed by the probe mark assessment subsystem determines whether a quantity of the probe mark is less than a fourth threshold value, and the probe test failure is indicated in the probe mark assessment result when the quantity of the probe mark is less than the fourth threshold value.

In some embodiments, the probe apparatus is stopped by the automation subsystem if the probe mark failure is indicated by the probe mark assessment result within a predetermined time limit.

In some embodiments, the method further includes uploading, by the probe mark assessment subsystem, an analyzed image of the test pads to the data server.

In some embodiments, the method further includes delivering, by a test result distribution subsystem, a report of the probe mark assessment result.

In some embodiments, the test result distribution subsystem delivers the report of the probe mark assessment result by electronic mail.

In some embodiments, the method further includes receiving, by an error-monitoring subsystem, an error code information and a lot control information from the automation subsystem, wherein the automation subsystem determines the error code information and the lot control information from the probe mark assessment result received from the probe mark assessment subsystem.

Accordingly, the test system and the method for testing the wafer of the present disclosure inspect the quality of the probe pins at the wafer test site. Moreover, abnormalities due to probe malfunctions can be determined automatically by image recognition of the probe marks with artificial intelligence algorithms, and the probe apparatus can be stopped promptly to avoid capacity loss. Errors and costs due to human inspection can be minimized.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
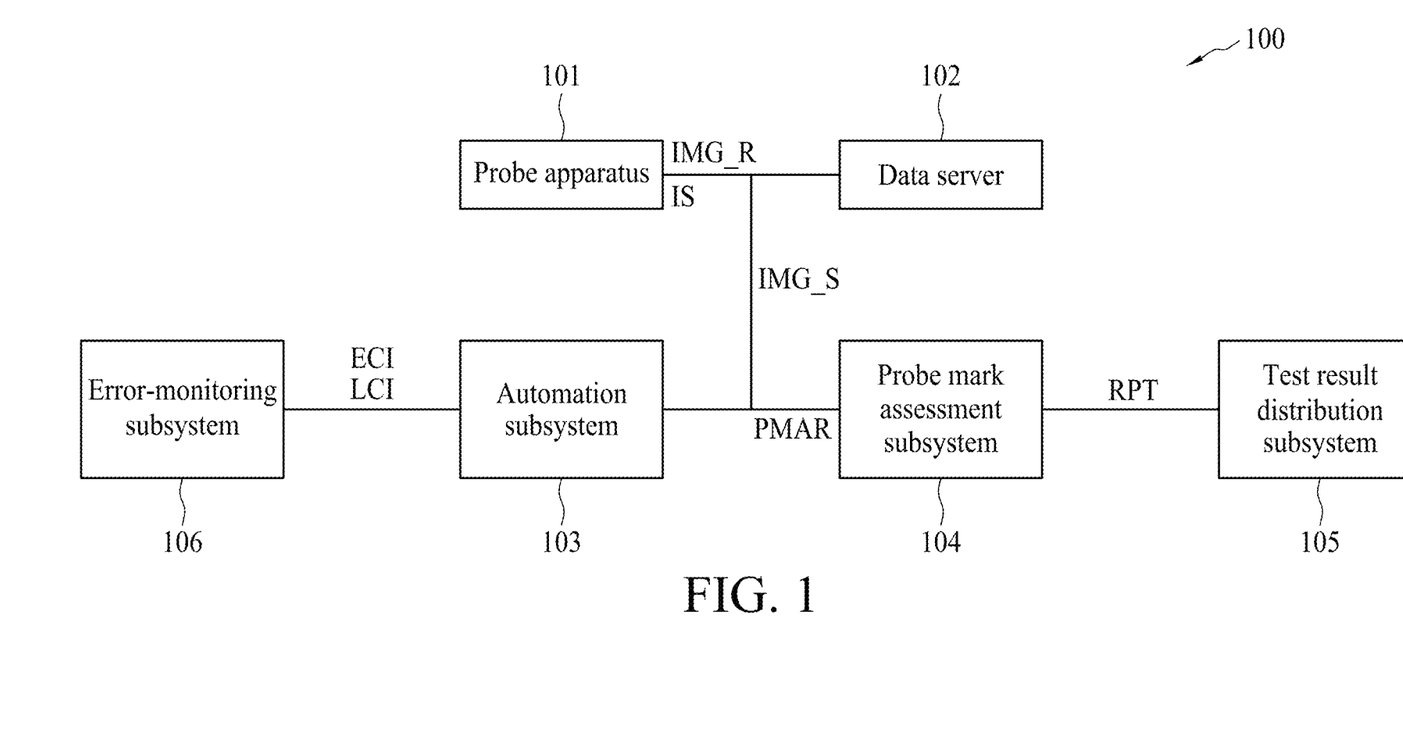
FIG. 1 is a schematic diagram of a test system of a wafer according to some embodiments of the present disclosure.
Figure 2:
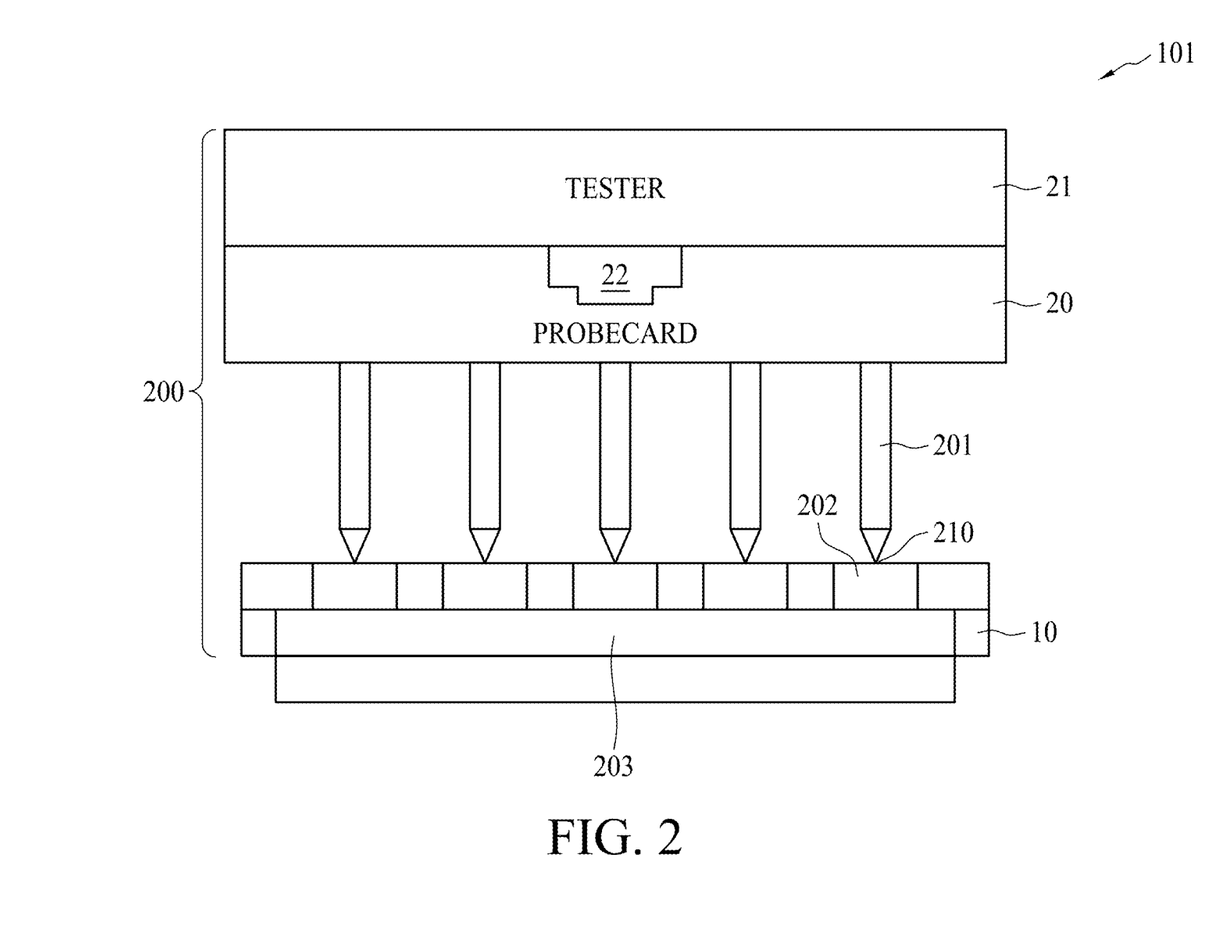
FIG. 2 is a schematic view of a test arrangement of a probe apparatus in a test system according to some embodiments of the present disclosure.

FIG. 1 is a schematic diagram of a test system 100 of a wafer 10 according to some embodiments of the present disclosure. FIG. 2 is a schematic view of a test arrangement 200 of a probe apparatus 101 in the test system 100 according to some embodiments of the present disclosure. With reference to FIG. 1 and FIG. 2, the test system 100 of the wafer 10 includes a probe apparatus 101, a data server 102, an automation subsystem 103, and a probe mark assessment subsystem 104. In some embodiments, the probe apparatus 101 includes a probe card 20, a tester 21, and a camera 22. The probe card 20 includes one or more probe pins 201 for contacting one or more test pads 202 on a device under test (DUT) 203 in the wafer 10. In some embodiments, the tester 21 provides an electrical signal to test the DUT 203, and the camera 22 captures an image IMG_R of the test pads 202 after the test pads 202 have been contacted by the probe pins 201. In some embodiments, the camera 22 may be a complementary metal-oxide semiconductor (CMOS) camera, a charge-coupled device (CCD) camera, a video camera, or another suitable type of camera. The DUT 203 may be a die that has completed front-end fabrication, for example. It should be noted that, although one DUT 203 is shown in FIG. 2, the wafer 10 may include a plurality of DUTs 203 each with one or more test pads 202 arranged in a suitable configuration for the particular application. Since the image IMG_R is captured by the camera 22 and automatically processed by the test system 100 at the wafer test site, damage to the probe pins 201 or other abnormalities of the probe pins 201 can be spotted earlier without losing excessive capacity due to manual checks.

In some embodiments, the probe apparatus 101 uploads the image IMG_R of the test pads 202 to the data server 102. The automation subsystem 103 obtains an image specification IS from the probe apparatus 101 and triggers an automated assessment of a probe mark 210 in the image IMG_R of the test pads 202. In some embodiments, the probe mark assessment subsystem 104 performs the automated assessment of the probe mark 210 in the image IMG_R of the test pads 202. In some embodiments, the probe mark assessment subsystem 104 may download the image IMG_R of the test pads 202 from the data server 102 and perform an image-processing operation to obtain a probe mark assessment result PMAR, and the automation subsystem 103 stops the probe apparatus 101 if the probe mark assessment result PMAR indicates a probe test failure.

Figure 3:
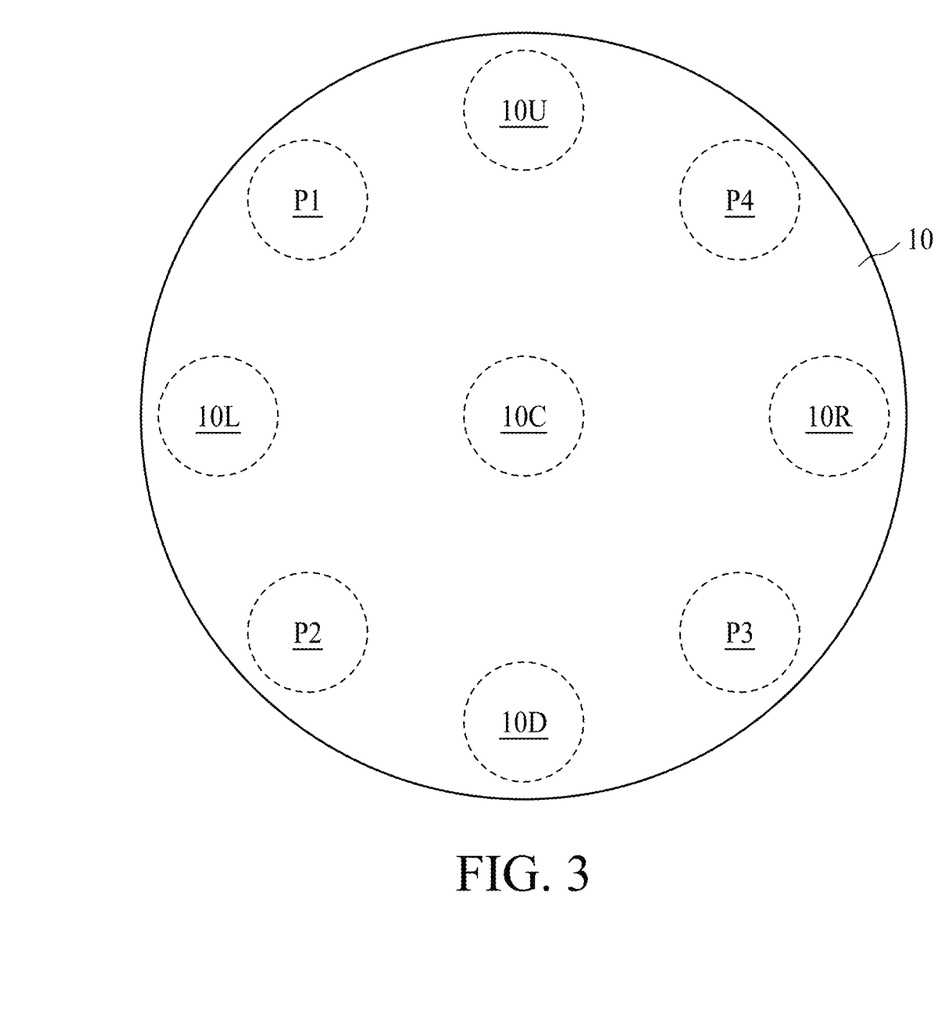
FIG. 3 is a schematic diagram of a plurality of probe mark inspection sites of a wafer according to some embodiments of the present disclosure.

FIG. 3 is a schematic diagram of a plurality of probe mark inspection sites of the wafer 10 according to some embodiments of the present disclosure. With reference to FIG. 3, probe mark inspections may be performed by the probe apparatus 101 of the test system 100 on the wafer 10 at a substantially center region 10C, a substantially left region 10L, a substantially right region 10R, a substantially top region 10U, and a substantially bottom region 10D of the wafer 10 to ensure proper quality inspection. Moreover, alignment pins may be set by the probe apparatus 101 substantially in the regions P1 to P4 of the wafer 10. It should be noted that the configuration shown in FIG. 3 of the probe mark inspections performed by the probe apparatus 101 on the wafer 10 may be adjusted according to the particular application. For example, although the configuration of FIG. 3 may be suitable for 12-inch wafers, in some embodiments, the probe mark inspection sites may be adjusted for 6-inch or 8-inch wafer applications.

Figure 4:
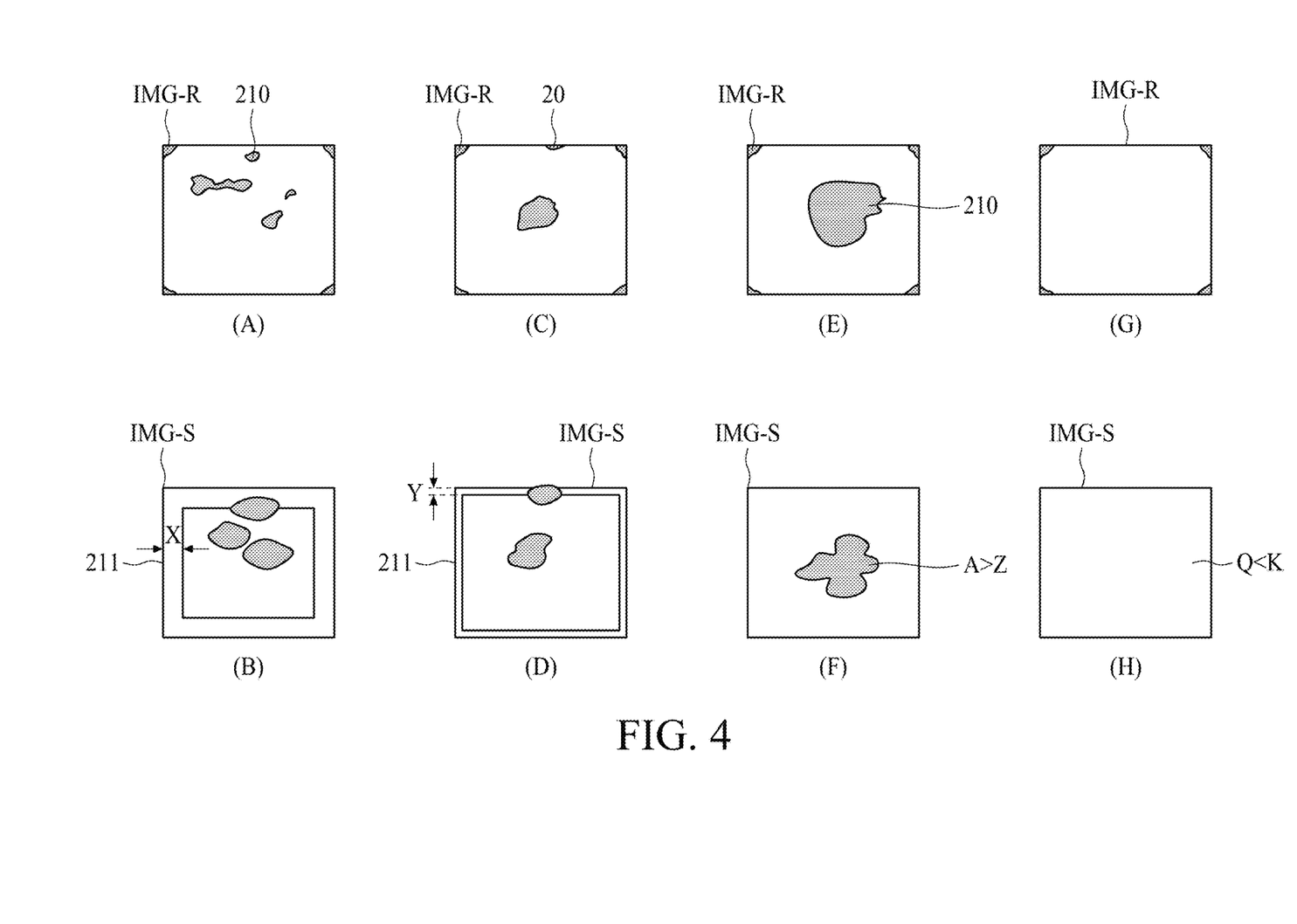
FIG. 4A is a schematic view of an image of a probe mark in a probe mark inspection according to some embodiments of the present disclosure.
FIG. 4B is a schematic view of an analyzed image of a probe mark in a probe mark inspection according to some embodiments of the present disclosure.
FIG. 4C is a schematic view of an image of a probe mark in a probe mark inspection according to some embodiments of the present disclosure.
FIG. 4D is a schematic view of an analyzed image of a probe mark in a probe mark inspection according to some embodiments of the present disclosure.
FIG. 4E is a schematic view of an image of a probe mark in a probe mark inspection according to some embodiments of the present disclosure.
FIG. 4F is a schematic view of an analyzed image of a probe mark in a probe mark inspection according to some embodiments of the present disclosure.
FIG. 4G is a schematic view of an image of a probe mark in a probe mark inspection according to some embodiments of the present disclosure.
FIG. 4H is a schematic view of an analyzed image of a probe mark in a probe mark inspection according to some embodiments of the present disclosure.

FIG. 4A is a schematic view of the image IMG_R of the probe mark 210 in a probe mark inspection, and FIG. 4B is a schematic view of an analyzed image IMG_S of the probe mark 210 in the probe mark inspection according to some embodiments of the present disclosure. With reference to the probe mark inspection of FIG. 4A and FIG. 4B, the automated assessment performed by the probe mark assessment subsystem 104 determines whether a distance from the probe mark 210 to a border 211 of the test pads 202 is within a first threshold value X, and the probe test failure is indicated in the probe mark assessment result PMAR when the distance from the probe mark 210 to the border 211 of the test pads 202 is within the first threshold value X, as shown in the analyzed image IMG_S of FIG. 4B. In such probe mark inspection, the analyzed image IMG_S indicates that the probe mark 210 is near the border 211 of the test pads 202.

FIG. 4C is a schematic view of the image IMG_R of the probe mark 210 in another probe mark inspection, and FIG. 4D is a schematic view of the analyzed image IMG_S of the probe mark 210 in the probe mark inspection according to some embodiments of the present disclosure. With reference to the probe mark inspection of FIG. 4C and FIG. 4D, the automated assessment performed by the probe mark assessment subsystem 104 determines whether a distance from the probe mark 210 to the border 211 of the test pads 202 is within a second threshold value Y, and the probe test failure is indicated in the probe mark assessment result PMAR when the distance from the probe mark 210 to the border 211 of the test pads 202 is within the second threshold value Y, as shown in the analyzed image IMG_S of FIG. 4D. In such probe mark inspection, the analyzed image IMG_S indicates that the probe mark 210 is at the border 211 of the test pads 202.

FIG. 4E is a schematic view of the image IMG_R of the probe mark 210 in another probe mark inspection, and FIG. 4F is a schematic view of the analyzed image IMG_S of the probe mark 210 in the probe mark inspection according to some embodiments of the present disclosure. With reference to the probe mark inspection of FIG. 4E and FIG. 4F, the automated assessment performed by the probe mark assessment subsystem 104 determines whether an area A of the probe mark 210 is greater than a third threshold value Z, and the probe test failure is indicated in the probe mark assessment result PMAR when the area A of the probe mark 210 is greater than the third threshold value Z, which is shown in the analyzed image IMG_S of FIG. 4F. In such probe mark inspection, the analyzed image IMG_S indicates that the area A of the probe mark 210 is greater than Z % (e.g. 25%) of an area of the test pads 202.

FIG. 4G is a schematic view of the image IMG_R of the probe mark 210 in another probe mark inspection, and FIG. 4H is a schematic view of the analyzed image IMG_S of the probe mark 210 in the probe mark inspection according to some embodiments of the present disclosure. With reference to the probe mark inspection of FIG. 4F and FIG. 4G, the automated assessment performed by the probe mark assessment subsystem 104 determines whether a quantity Q of the probe mark 210 is less than a fourth threshold value K, and the probe test failure is indicated in the probe mark assessment result PMAR when the quantity Q of the probe mark 210 is less than the fourth threshold value K, which is shown in the analyzed image IMG_S of FIG. 4H. In such probe mark inspection, the analyzed image IMG_S indicates that the quantity Q of the probe mark 210 is less than K (e.g., K=1) of an area of the test pads 202, or that an error occurred since there is no probe mark 210.

It should be noted that the automated assessment performed by the probe mark assessment subsystem 104 may include an image-processing operation utilizing artificial intelligence image recognition algorithms. Such algorithms may include, but are not limited to, deep-learning image recognition algorithms or other suitable image-processing algorithms as the particular application may require.

In some embodiments, the automation subsystem 103 may also stop the probe apparatus 101 if the probe mark failure is indicated by the probe mark assessment result PMAR within a predetermined time limit, such as within 100 seconds, 400 seconds, or other suitable time limits. In some embodiments, the probe mark assessment subsystem 104 uploads the analyzed image IMG_S of the test pads 202 to the data server 102.

In some embodiments, with reference to FIG. 1, the test system 100 may further include a test result distribution subsystem 105 for delivering a report RPT of the probe mark assessment result PMAR. In some embodiments, test result distribution subsystem 105 delivers the report RPT of the probe mark assessment result PMAR by electronic mail, and a target audience of the report RPT may include, but is not limited to, the operators or equipment manufacturers of the probe apparatus 101.

In some embodiments, with reference to FIG. 1, the test system 100 further includes an error-monitoring subsystem 106 for receiving an error code information ECI and a lot control information LCI from the automation subsystem 103. In some embodiments, the automation subsystem 103 determines the error code information ECI and the lot control information from the probe mark assessment result received from the probe mark assessment subsystem. With the test result distribution subsystem 105 and the error-monitoring subsystem 106, operators can quickly pinpoint the time and cause of probe mark failures and thus avoid capacity loss during wafer testing.

Figure 5:
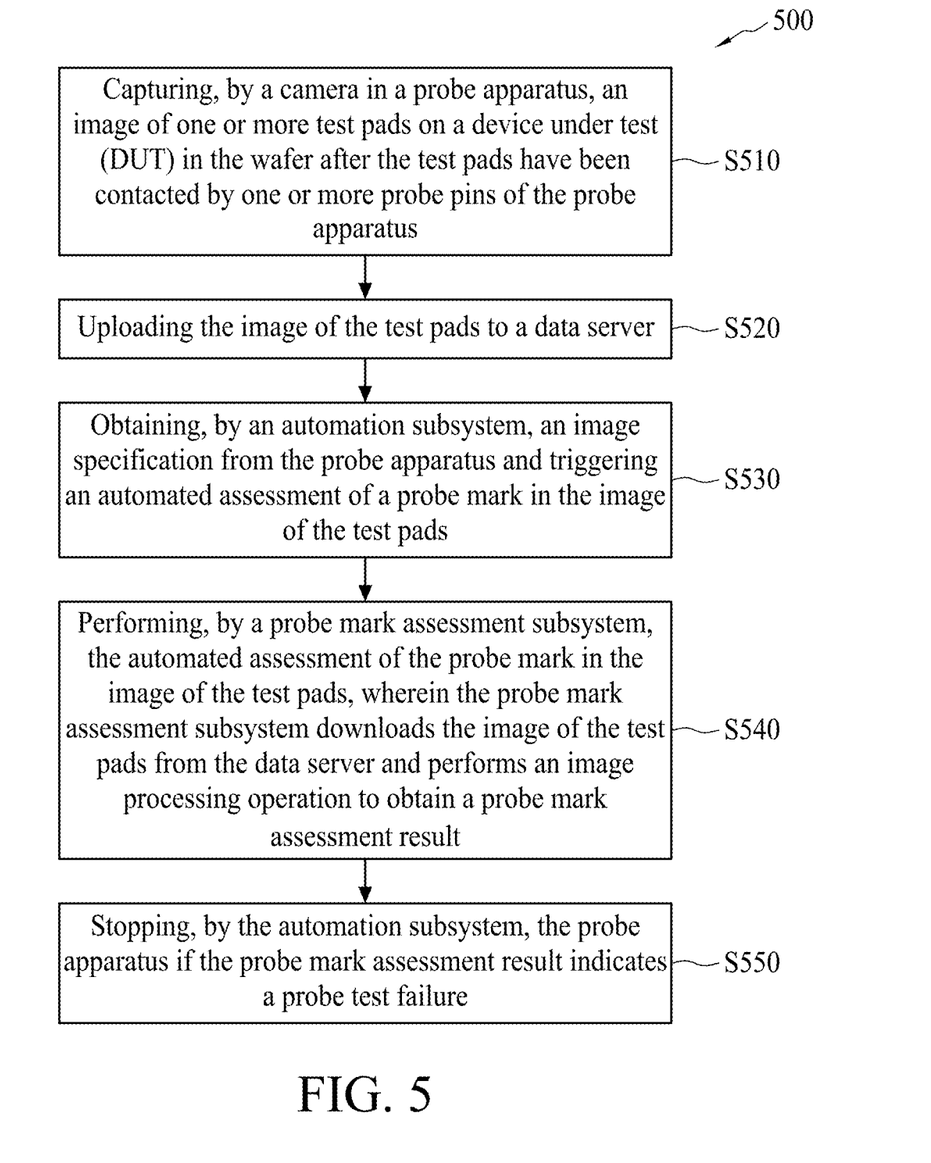
FIG. 5 is a flow diagram of a method for testing a wafer according to some embodiments of the present disclosure.

According to some embodiments of the present disclosure, a method 500 for testing the wafer 10 can be provided with reference to the test system 100 depicted in FIG. 1 to FIG. 4. FIG. 5 is a flow diagram of the method 500 for testing the wafer 10 according to some embodiments of the present disclosure. With reference to FIG. 5, the method 500 for testing the wafer 10 includes, in a Step S510, capturing, by the camera 22 in the probe apparatus 101, the image IMG_R of one or more test pads 202 on the device under test (DUT) 203 in the wafer 10 after the test pads 202 have been contacted by one or more probe pins 201 of the probe apparatus 101. In a Step 520, the image of the test pads 202 is uploaded to the data server 102. In a Step 530, an image specification IS is obtained from the probe apparatus 101 by the automation subsystem 193, and an automated assessment of the probe mark 210 in the image IMG_R of the test pads is triggered. In a Step S540, the automated assessment of the probe mark 210 in the image IMG_R of the test pads 202 is performed by the probe mark assessment subsystem 104. The probe mark assessment subsystem 104 downloads the image IMG_R of the test pads 202 from the data server 102 and performs an image-processing operation to obtain the probe mark assessment result PMAR. In a Step S550, the probe apparatus 101 is stopped by the automation subsystem 103 if the probe mark assessment result PMAR indicates the probe test failure.

In some embodiments, with reference to FIG. 4A and FIG. 4B, the automated assessment performed by the probe mark assessment subsystem 104 determines whether a distance from the probe mark 210 to the border 211 of the test pads 202 is within the first threshold value X, and the probe test failure is indicated in the probe mark assessment result PMAR when the distance from the probe mark 210 to the border 211 of the test pads 202 is within the first threshold value X.

In some embodiments, with reference to FIG. 4C and FIG. 4D, the automated assessment performed by the probe mark assessment subsystem 104 determines whether a distance from the probe mark 210 to the border 211 of the test pads 202 is within the second threshold value Y, and the probe test failure is indicated in the probe mark assessment result PMAR when the distance from the probe mark 210 to the border 211 of the test pads 202 is within the second threshold value Y.

In some embodiments, with reference to FIG. 4E and FIG. 4F, the automated assessment performed by the probe mark assessment subsystem 104 determines whether the area A of the probe mark 210 is greater than the third threshold value Z, and the probe test failure is indicated in the probe mark assessment result PMAR when the area A of the probe mark is greater than the third threshold value Z.

In some embodiments, with reference to FIG. 4G and FIG. 4H, the automated assessment performed by the probe mark assessment subsystem 104 determines whether a quantity Q of the probe mark 210 is less than the fourth threshold value K, and the probe test failure is indicated in the probe mark assessment result PMAR when the quantity Q of the probe mark 210 is less than the fourth threshold value K.

In some embodiments, the probe apparatus 101 is stopped by the automation subsystem 103 if the probe mark failure is indicated by the probe mark assessment result PMAR within a predetermined time limit. In some embodiments, the method 500 further includes uploading, by the probe mark assessment subsystem 104, the analyzed image IMG_S of the test pads 202 to the data server 102.

In some embodiments, the method 500 further includes delivering, by the test result distribution subsystem 105, the report RPT of the probe mark assessment result PMAR. In some embodiments, the test result distribution subsystem 105 delivers the report RPT of the probe mark assessment result PMAR by electronic mail.

In some embodiments, the method 500 further includes receiving, by the error-monitoring subsystem 106, the error code information ECI and the lot control information LCI from the automation subsystem 193. The automation subsystem 103 determines the error code information ECI and the lot control information LCI from the probe mark assessment result PMAR received from the probe mark assessment subsystem 104.

Figure 6:
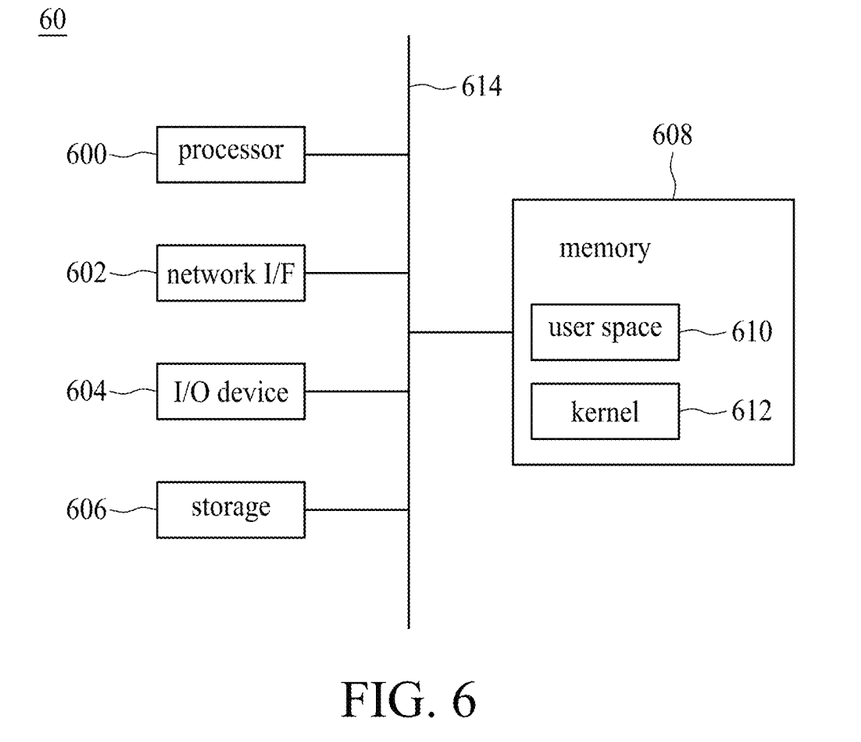
FIG. 6 is a block diagram of a processing device of a test system in accordance with some embodiments of the present disclosure.

It should be noted that the test system 100 depicted in FIG. 1 may also include a processing device for realizing one or more of the tools, subsystems, methods, or operations described with respect to FIG. 1 to FIG. 5. FIG. 6 is a block diagram of a processing device 60 of the test system 100 in accordance with some embodiments of the present disclosure. The processing device 60 may include a processor 600, a memory 608, a network interface (I/F) 602, a storage 606, and an input/output (I/O) device 604 communicatively coupled via a bus 614 or other interconnection communication mechanism. The memory 608 includes, in some embodiments, a random access memory (RAM), other dynamic storage device, read-only memory (ROM), or other static storage device, coupled to the bus 614 for storing data or instructions to be executed by the processor 600, e.g., kernel 612, user space 610, portions of the kernel or the user space, and components thereof. The memory 608 is also used, in some embodiments, for storing temporary variables or other intermediate information during execution of instructions to be executed by the processor 600.

In some embodiments, a storage device 606, such as a magnetic disk or optical disk, is coupled to the bus 614 for storing data or instructions, e.g., kernel 612, user space 610, etc. The I/O device 604 includes an input device, an output device, or a combined input/output device for enabling user interaction with the test system 100. An input device comprises, for example, a keyboard, keypad, mouse, trackball, trackpad, or cursor direction keys for communicating information and commands to the processor 600. An output device includes, for example, a display, a printer, a voice synthesizer, etc. for communicating information to a user. In some embodiments, one or more operations or functionality of the tools or systems described with respect to FIGS. 1 to 5 are realized by the processor 600, which is programmed for performing such operations and functionality. One or more of the memory 608, the I/F 602, the storage 606, the I/O device 604, and the bus 614 are operable to receive instructions, data, design rules, netlists, layouts, models and other parameters for processing by the processor 600.

In some embodiments, one or more of the operations, functionality of the tools, and systems described with respect to FIG. 1 to FIG. 5 are implemented by specifically-configured hardware (e.g., by one or more application-specific integrated circuits (ASICs) which are included) separate from or in lieu of the processor 600. Some embodiments incorporate more than one of the described operations or functionality in a single ASIC. In some embodiments, the operations and functionality are realized as functions of a program stored in a non-transitory computer-readable recording medium. Examples of a non-transitory computer-readable recording medium include, but are not limited to, external/removable or internal/built-in storage or memory unit, e.g., one or more of an optical disk, such as a DVD, a magnetic disk, such as a hard disk, a semiconductor memory, such as a ROM, a RAM, a memory card, and the like.

Accordingly, the test system 100 and the method 500 for testing the wafer 10 of the present disclosure inspect the quality of the probe pins 210 at the wafer test site. Moreover, abnormalities due to probe malfunctions can be determined automatically by image recognition of the probe marks with artificial intelligence algorithms, and the probe apparatus 101 can be stopped promptly to avoid capacity loss. Errors and costs due to human inspection can be minimized.

One aspect of the present disclosure provides a test system of a wafer including a probe apparatus, a data server, an automation subsystem, and a probe mark assessment subsystem. The probe apparatus includes a probe card, a tester, and a camera, wherein the probe card includes one or more probe pins for contacting one or more test pads on a device under test (DUT) in the wafer, the tester provides an electrical signal to test the DUT, and the camera captures an image of the test pads after the test pads have been contacted by the probe pins. The probe apparatus uploads the image of the test pads to the data server. The automation subsystem obtains an image specification from the probe apparatus and triggers an automated assessment of a probe mark in the image of the test pads. The probe mark assessment subsystem performs the automated assessment of the probe mark in the image of the test pads, wherein the probe mark assessment subsystem downloads the image of the test pads from the data server and performs an image-processing operation to obtain a probe mark assessment result, and the automation subsystem stops the probe apparatus if the probe mark assessment result indicates a probe test failure.

Another aspect of the present disclosure provides a method for testing a wafer, including capturing, by a camera in a probe apparatus, an image of one or more test pads on a device under test (DUT) in the wafer after the test pads have been contacted by one or more probe pins of the probe apparatus; uploading the image of the test pads to a data server; obtaining, by an automation subsystem, an image specification from the probe apparatus and triggering an automated assessment of a probe mark in the image of the test pads; performing, by a probe mark assessment subsystem, the automated assessment of the probe mark in the image of the test pads, wherein the probe mark assessment subsystem downloads the image of the test pads from the data server and performs an image-processing operation to obtain a probe mark assessment result; and stopping, by the automation subsystem, the probe apparatus if the probe mark assessment result indicates a probe test failure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A test system of a wafer, comprising:
a probe apparatus comprising a probe card, a tester, and a camera coupled with each other to form a single unit, wherein the probe card comprises one or more probe pins for contacting one or more test pads on a device under test (DUT) in the wafer, the tester provides an electrical signal to test the DUT, and the camera captures an image of the test pads after the test pads have been contacted by the probe pins;
wherein the probe apparatus defines a plurality of probe mark inspection sites of the wafer for probe mark inspection, wherein the plurality of probe mark inspection sites are a center region, a plurality of peripheral regions on the wafer, and a plurality of alignment regions on the wafer alternating with the peripheral regions;
a data server, wherein the probe apparatus uploads the image of the test pads to the data server;
an automation subsystem obtaining an image specification from the probe apparatus and triggering an automated assessment of a probe mark in the image of the test pads, wherein the probe apparatus is controlled to operate or stop operated by the automation subsystem; and a probe mark assessment subsystem for performing the automated assessment of the probe mark in the image of the test pads to generate an analyzed image of the probe mark in the probe mark inspection, wherein the probe mark assessment subsystem downloads the image of the test pads from the data server, uploads the analyzed image to the data server, and performs an image-processing operation to obtain a probe mark assessment result so as to indicate whether a probe test by the probe apparatus is failed or not, and the automation subsystem stops an operation of the probe apparatus if the probe mark assessment result indicates a probe test failure;

wherein the automated assessment performed by the probe mark assessment subsystem assesses a horizontal distance from the probe mark to a border of the test pads in the analyzed image, wherein the probe mark assessment subsystem has a first threshold value, and the probe test failure is indicated in the probe mark assessment result when the horizontal distance from the probe mark to the border of the test pads is within the first threshold value, wherein the analyzed image indicates that the probe mark is near the border of the test pads, such that the automation subsystem stops the probe apparatus when the horizontal distance from the probe mark to the border of the test pads is within the first threshold value;

wherein the automated assessment performed by the probe mark assessment subsystem assesses a vertical distance from the probe mark to a border of the test pads in the analyzed image, wherein the probe mark assessment subsystem has a second threshold value, and the probe test failure is indicated in the probe mark assessment result when the vertical distance from the probe mark to the border of the test pads is within the second threshold value, wherein the analyzed image indicates that the probe mark is near the border of the test pads, such that the automation subsystem stops the probe apparatus when the vertical distance from the probe mark to the border of the test pads is within the second threshold value;

wherein the automated assessment performed by the probe mark assessment subsystem assesses an area of the probe mark in the analyzed image, wherein the probe mark assessment subsystem has a third threshold value defined by a preset percentage of an area of the test pads, and the probe test failure is indicated in the probe mark assessment result when the area of the probe mark is greater than the third threshold value in the analyzed image, wherein the analyzed image indicates that the area of the probe mark is greater than the preset percentage of an area of the test pads, such that the automation subsystem stops the probe apparatus when the area of the probe mark is greater than the threshold value;

wherein the automated assessment performed by the probe mark assessment subsystem assesses a quantity of the probe mark in the analyzed image, wherein the probe mark assessment subsystem has a fourth threshold value, and the probe test failure is indicated in the probe mark assessment result when the quantity of the probe mark is less than the fourth threshold value, wherein the analyzed image indicates that the quantity of the probe mark on an area of the test pad, such that the automation subsystem stops the probe apparatus when the quantity of the probe mark is less than the fourth threshold value.

2. The test system of claim 1, wherein the automation subsystem stops the probe apparatus if the probe mark failure is indicated by the probe mark assessment result within a predetermined period of time of the operation of the probe apparatus, such that the automation subsystem stops the probe apparatus when the operation of the probe apparatus is over the period of time.

3. The test system of claim 1, wherein the camera is selected from a group consisting of a complementary metal-oxide semiconductor (CMOS) camera and a video camera.

4. The test system of claim 1, wherein the test system further comprises a test result distribution subsystem for delivering a report of the probe mark assessment result.

5. The test system of claim 4, wherein the report of the probe mark assessment result in electronic form is sent by the test result distribution subsystem to an operator of the probe apparatus.

6. The test system of claim 1, wherein the test system further comprises an error-monitoring subsystem receiving an error code information and a lot control information from the automation subsystem, wherein the automation subsystem determines the error code information and the lot control information from the probe mark assessment result received from the probe mark assessment subsystem.

7. A method for testing a wafer, comprising the steps of:
capturing, by a camera in a probe apparatus, an image of one or more test pads on a device under test (DUT) in the wafer after the test pads have been contacted by one or more probe pins of the probe apparatus;
defining a plurality of probe mark inspection sites of the wafer for probe mark inspection by the probe apparatus, wherein the plurality of probe mark inspection sites are a center region, a plurality of peripheral regions on the wafer, and a plurality of alignment regions on the wafer alternating with the peripheral regions;
uploading the image of the test pads to a data server;
obtaining, by an automation subsystem, an image specification from the probe apparatus and triggering an automated assessment of a probe mark in the image of the test pads;
performing, by a probe mark assessment subsystem, the automated assessment of the probe mark in the image of the test pads to generate an analyzed image of the probe mark in the probe mark inspection, wherein the probe apparatus is controlled to operate or stop operated by the 15 automation subsystem, wherein the probe mark assessment subsystem downloads the image of the test pads from the data server, uploads the analyzed image to the data server, and performs an image-processing operation to obtain a probe mark assessment result so as to indicate whether a probe test by the probe apparatus is failed or not; and
stopping, by the automation subsystem, an operation of the probe apparatus if the probe mark assessment result indicates a probe test failure; wherein
assessing a horizontal distance from the probe mark to a border of the test pads in the analyzed image by the automated assessment performed by the probe mark assessment subsystem, wherein the probe mark assessment subsystem has a first threshold value, and the probe test failure is indicated in the probe mark assessment result when the horizontal distance from the probe mark to the border of the test pads is within the first threshold value, wherein the analyzed image indicates that the probe mark is near the border of the test pads, such that the automation subsystem stops the probe apparatus when the horizontal distance from the probe mark to the border of the test pads is within the first threshold value; wherein assessing a vertical distance from the probe mark to a border of the test pads in the analyzed image by the automated assessment performed by the probe mark assessment subsystem, wherein the probe mark assessment subsystem has a second threshold value, and the probe test failure is indicated in the probe mark assessment result when the vertical distance from the probe mark to the border of the test pads is within the second threshold value, wherein the analyzed image indicates that the probe mark is near the border of the test pads, such that the automation subsystem stops the probe apparatus when the vertical distance from the probe mark to the border of the test pads is within the second threshold value;

assessing an area of the probe mark in the analyzed image by the automated assessment performed by the probe mark assessment subsystem, wherein the probe mark assessment subsystem has a third threshold value defined by a preset percentage of an area of the test pads, and the probe test failure is indicated in the probe mark assessment result when the area of the probe mark is greater than the third threshold value in the analyzed image, wherein the analyzed image indicates that the area of the probe mark is greater than the preset percentage of an area of the test pads, such that the automation subsystem stops the probe apparatus when the area of the probe mark is greater than the third threshold value; and assessing a quantity of the probe mark in the analyzed image by the automated assessment performed by the probe mark assessment subsystem assesses a quantity of the probe mark in the analyzed image, wherein the probe mark assessment subsystem has a fourth threshold value, and the probe test failure is indicated in the probe mark assessment result when the quantity of the probe mark is less than the fourth threshold value, wherein the analyzed image indicates that the quantity of the probe mark on an area of the test pad, such that the automation subsystem stops the probe apparatus when the quantity of the probe mark is less than the fourth threshold value.

8. The method of claim 7, wherein the automation subsystem stops the probe apparatus if the probe mark failure is indicated by the probe mark assessment result within a predetermined period of time of the operation of the probe apparatus, such that the automation subsystem stops the probe apparatus when the operation of the probe apparatus is over the period of time.

9. The method of claim 7, wherein the camera is selected from a group consisting of a complementary metal-oxide semiconductor (CMOS) camera and a video camera.

10. The method of claim 7, further comprising delivering, by a test result distribution subsystem, a report of the probe mark assessment result.

11. The method of claim 10, wherein the report of the probe mark assessment result in electronic form is sent by the test result distribution subsystem to an operator of the probe apparatus.

12. The method of claim 7, further comprising receiving, by an error-monitoring subsystem, an error code information and a lot control information from the automation subsystem, wherein the automation subsystem determines the error code information and the lot control information from the probe mark assessment result received from the probe mark assessment subsystem.

\* \* \* \* \*